United States Patent [19]

Sakata et al.

[11] Patent Number: 5,705,423
[45] Date of Patent: Jan. 6, 1998

[54] EPITAXIAL WAFER

[75] Inventors: Atsuto Sakata, Miyagi-ken; Hisashi Masumura; Hideo Kudo, both of Fukushima-ken, all of Japan

[73] Assignee: Shin-Etsu Handotai Co., Ltd., Tokyo, Japan

[21] Appl. No.: 557,947

[22] Filed: Nov. 14, 1995

[30] Foreign Application Priority Data

Nov. 14, 1994 [JP] Japan ................... 6-279515

[51] Int. Cl.⁶ .............................. H01L 21/20
[52] U.S. Cl. .......................... 437/81; 148/33.4
[58] Field of Search ................ 437/81; 148/33.4

[56] References Cited

FOREIGN PATENT DOCUMENTS

| | | |
|---|---|---|
| 0 617 456 A2 | 9/1994 | European Pat. Off. |
| 61-147522 | 7/1986 | Japan . |
| 61-208212 | 9/1986 | Japan . |
| 62-71214 | 4/1987 | Japan . |
| 1-011754 | 1/1989 | Japan . |
| 1-087148 | 3/1989 | Japan . |
| 0482288 | 3/1992 | Japan . |
| 4-96247 | 3/1992 | Japan . |
| 60-045301 | 2/1994 | Japan . |
| 06181193 | 6/1994 | Japan . |
| 08139033 | 5/1996 | Japan . |

*Primary Examiner*—John Niebling
*Assistant Examiner*—Long Pham
*Attorney, Agent, or Firm*—Wenderoth, Lind & Ponack

[57] ABSTRACT

An improved and highly productive method is proposed for the preparation of an epitaxial wafer (EPW) consisting of a single crystal silicon wafer as the substrate having a mirror-polished surface and an epitaxial layer of silicon formed on the mirror-polished surface of the substrate by the method of vapor-phase growing. Different from conventional methods in which the mirror-polishing of the substrate surface is conducted in several steps including, usually, the primary, secondary and finish polishing steps taking a great deal of labor and time, it has been unexpectedly discovered that an EPW having excellent properties not inferior to those conventional EPWs can be obtained by conducting the mirror-polishing with the primary polishing only omitting the subsequent steps provided that the thus mirror-polished surface of the substrate has a surface roughness RMS in the range from 0.3 to 1.2 mm.

2 Claims, 4 Drawing Sheets

EPITAXIAL WAFER

BACKGROUND OF THE INVENTION

The present invention relates to an epitaxial wafer, referred to as an EPW hereinafter, by the vapor-phase growing of an epitaxial layer consisting of a single crystalline layer of silicon on the mirror-polished surface of a single crystal wafer of silicon after mirror polishing, referred to simply as a mirror-polished wafer hereinafter, as well as to an improved method for the preparation thereof.

As a base material for the manufacture of semiconductor devices such as discretes, bipolar ICs and MOS devices, application fields of EPWs mainly based on a single crystal of silicon are under expansion year by year and the amount of consumption thereof is also rapidly growing.

Taking a bipolar IC as a typical example of their applications, those under use are the EPWs by the vapor-phase growing of an epitaxial layer of n-type silicon having a thickness of several micrometers on a mirror-polished wafer of low-resistivity grade of which the type of electroconductivity is the p-type.

The mirror-polished wafers to be used as the substrate under use have a thickness of around 450 to 800 µm though dependent on the diameter thereof and, as to the electric resistivity thereof, both classes including those having around 1 to 30 ohm.cm in the case of standard mirror-polished wafers and those having about 0.01 ohm.cm classified to the so-called low-resistivity products are used. As to the proportion of use between these two classes, the low-resistivity products occupy a major fraction as a total of the p- and n-type ones.

On the other hand, the film thickness of the epitaxial layer of silicon is, though widely varied depending on the intended particular application field, in the range from 1 to 15 µm for the bipolar ICs and bipolar CMOSs as an example for those having a relatively small thickness or several tens of µm for the discretes as those having a relatively large thickness and, as a trend in recent years, those under manufacturing include those of the submicron range having a thickness not exceeding 1 µm for the small thickness and those exceeding 100 µm for IGBTs for the large thickness.

In the next place, to describe a standard method for the preparation of a mirror-polished wafer to serve as the substrate of EPWs, preparation is performed in such a way that a silicon single crystal rod pulled up by the Czochralski method from a melt of silicon admixed in advance with a dopant so as to give a specified type of electroconductivity and appropriate resistivity is subjected to cylindrical grinding with the axial line of the direction of pulling up as the axis of rotation followed by a shaving work on the cylindrical periphery along the direction of the axial line to serve as an orientation flat of the wafers and then slicing in a direction perpendicular to the axis of the rod to give sliced wafers from which a chemically etched wafer is obtained after the works such as chamfering, lapping on both flat surfaces, chemical etching and the like and the chemically etched wafer is subjected to mirror polishing.

Incidentally, steps such as washing, drying and the like intervene during these process steps and, in addition, the mirror polishing of the above mentioned chemically etched wafer is preceded in some cases by the intervention of a donor-killer heat treatment and a treatment for imparting so-called extrinsic gettering effect such as sand blasting.

The mirror-polishing in the prior art is conducted by undertaking the mechanochemical polishing method in which polishing is performed by the combination of the mechanical action of the isolated abrasive particles and the etching action of an etching solution on the polished surface. This polishing process usually consists of two or three steps. Namely, the steps are named as the primary polishing, secondary polishing and finish polishing in the sequential order of the steps. The respective polishing conditions are set along with the number of repeating times of the polishing works by successively moderating the conditions of polishing relative to selection of abrasive particles having a finer and freer particle size or use of an abrasive cloth having decreasing hardness in such a way that a decreased value of the surface roughness decreased deviation from flatness can be obtained on the mirror polished surface in each of the steps.

Thus, it is usual that the mirror-polished wafers as the substrate of EPWs currently under use have a surface roughness expressed by the RMS (root-mean-square) smaller than 0.3 nm as measured by an atomic force microscope over a measuring area of 1 µm×1 µm wide.

In view of the very strict standardization required for the crystallinity and surface roughness as well as the purity, the silicon epitaxial layer in the above mentioned EPW is under control with utmost care in order to avoid contamination of the starting materials and inside of the epitaxial growing apparatus so that, as a result, the epitaxial layer has an extremely high purity. Accordingly, the surface of an epitaxial layer once formed is never subjected to another polishing work and transferred directly to the manufacturing process of semiconductor devices.

Therefore, it is a common practice that a strict control is undertaken for the surface condition, e.g., flatness, surface roughness and contamination with foreign matters, of a mirror-polished wafer to be used as the substrate of EPWs and elaborate mirror-polishing in several steps, washing treatment and the like are undertaken.

As to the mirror-polished wafers to be used as a substrate of EPWs, the constituting proportion of those having low resistivity values is increasing as is mentioned above.

On the other hand, it has become clear that following problems are encountered in the process to conduct precision mirror-polishing of such a chemically etched wafer of the low-resistivity grade. Namely:

(1) As compared with polishing of a chemically etched wafer having an electric resistivity in the standard range, the polishing velocity is low and about 1.5 to almost 2 times length of time is taken for removing a specified polishing allowance. Therefore, the productivity of the wafer polishing process cannot be high;

(2) Extension of the polishing time usually causes a decrease in the flatness of the mirror-polished wafer;

(3) Extension of the polishing time usually causes occurrence of cavities such as pits although the mechanism therefor is not clear and (4) Sloped surface area and periodical ruggedness for an unknown reason are caused in the marginal area of the wafer.

SUMMARY OF THE INVENTION

The present invention accordingly has an object to provide an EPW and a method for the preparation thereof by which the decrease in the productivity and decrease in the quality of the mirror-polished surface in the manufacture of mirror-polished wafers of such a low-resistivity grade can be avoided and which is applicable also to the manufacture of mirror-polished wafers of the standard resistivity grade whereby a great improvement can be accomplished in the productivity and production cost.

Thus, the epitaxial wafer provided by the present invention is an integral body which comprises:

(a) a single crystal silicon wafer; and (b) an epitaxial layer of silicon formed by the vapor-phase growing method on at least one of the flat surfaces of the single crystal silicon wafer, the surface of the single crystal silicon wafer, on which the epitaxial layer of silicon is formed, having a surface roughness in the range from 0.3 nm to 1.2 nm as expressed in terms of the RMS (root-mean-square).

The above described epitaxial wafer of the invention is prepared by a method which comprises the steps of:

i) subjecting one of the flat surfaces of a single crystal silicon wafer to a primary mirror-polishing treatment to such an extent that the polished surface has a surface roughness in the range from 0.3 nm to 1.2 nm as expressed in terms of the RMS (root-mean-square); and ii) forming an epitaxial layer of silicon by the vapor-phase growing method on the mirror-polished surface of the single crystal silicon wafer.

DETAILED DESCRIPTION OF THE PREFERRED EMBODIMENTS

Figure 1:
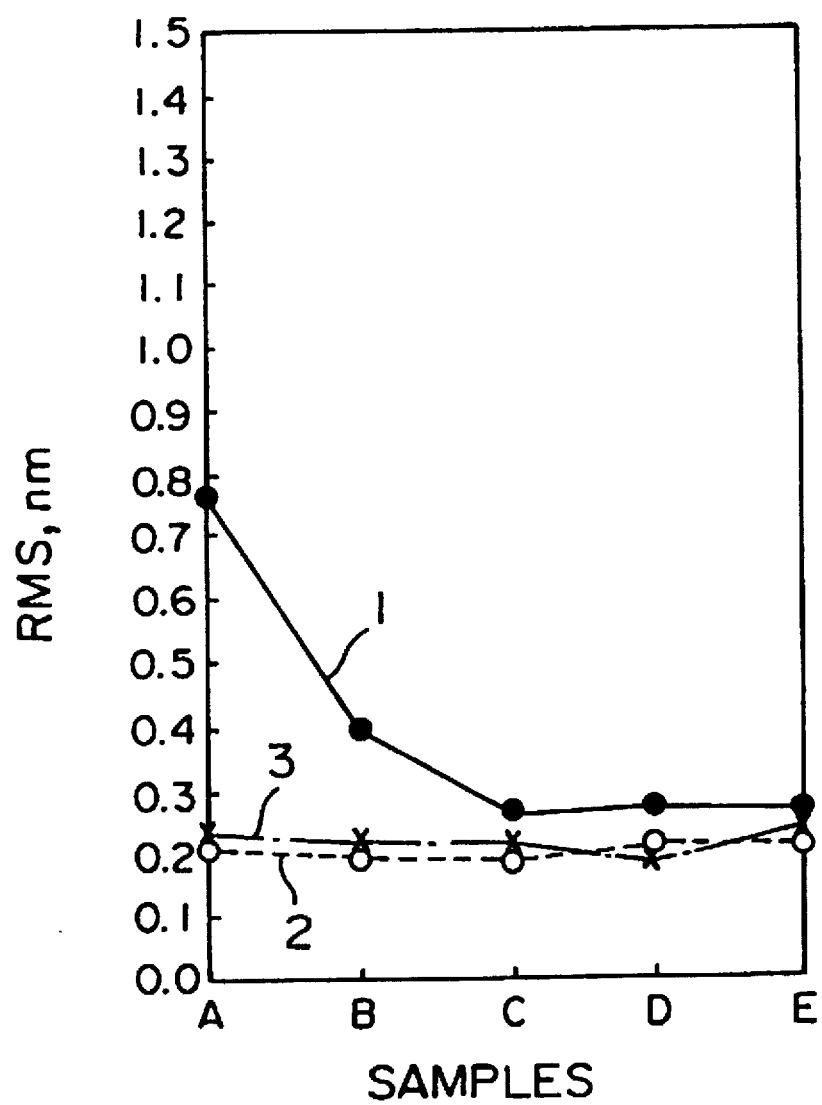
FIG. 1 shows the surface roughness of wafers prepared by mirror-polishing under different conditions in Example 1 and Comparative Examples 1 to 4.

The EPW according to the present invention is characterized in that the mirror-polishing to prepare a mirror-polished wafer to serve as the substrate thereof by the method of mechanochemical polishing, which has been conducted in several steps in the prior art, is limited to complete by a single step of the primary mirror-polishing only so that the surface of the mirror-polished wafer after polishing has a surface roughness of 1.2 nm or less or, preferably, in the range from 0.8 nm to 1.2 nm as indicated by the RMS of the surface roughness over a measuring area of 1 μm×1 μm by an atomic force microscope and an epitaxial layer of silicon is grown in the vapor phase on the mirror-polished surface of the silicon wafer after the primary mirror-polishing.

As to the electric resistivity of the mirror-polished wafer of silicon after the above mentioned primary mirror-polishing, the applicability of the invention is obtained to all of those having 50 ohm.cm or lower and the advantage is still more remarkable in the low-resistivity products having an electric resistivity of as low as 0.1 ohm.cm or even lower for which the prior art mirror polishing method had many problems.

The method for the preparation of the EPW according to the present invention is characterized in that a single crystal rod of silicon, after cylindrical grinding with the axis of the single crystal rod as the rotating axis, is subjected to shaving in a part along the cylindrical periphery in parallel to the axis for the formation of the orientation flat in the wafers and slicing the rod in a plane perpendicular to the axis to give sliced wafers from which a chemically etched wafer is obtained after works including chamfering, lapping on both flat surfaces, chemical etching and the like and the chemically etched wafer is subjected to the primary mirror-polishing treatment only to give a mirror-polished single crystal wafer of silicon which is, after washing and drying, subjected to vapor-phase growing of an-epitaxial layer of silicon on the mirror-polished surface.

As is described above, strict control of the surface condition is required for conventional mirror-polished wafers to be used as a substrate of EPWs. This is because, in connection with the crystallinity and surface roughness as well as purity and the like of the epitaxially grown layer by the vapor-phase growing method on the mirror-polished surface of a wafer, it is accepted that the surface condition thereof has a direct influence on the properties of the epitaxial silicon layer.

Accordingly, the inventors have conducted extensive investigations by undertaking simulation tests to examine the influences of the surface roughness of mirror-polished wafers on the surface roughness of an EPW prepared therefrom and an assumed semiconductor device manufactured therefrom arriving at a conclusion that, relative to the surface roughness of the EPW thus formed and the electric voltage-withstanding characteristic of the assumed semiconductor device, the extent of the influence by the surface roughness of the mirror-polished wafer is relatively small provided that the requirement of the present invention is satisfied leading to the present invention.

The surface roughness implied in the present invention is the so-called "haze" corresponding to the microscopic surface roughness on the mirror-polished surface of a wafer and it is observed also by an atomic force microscope to have a period of 0.01 to 0.1 μm with a P-V (peak-to-valley) value of 0.5 to 5 nm therein and, in the visual inspection under a focusing lamp, it can be observed by the light scattering thereby.

Though not particularly limitative, it is convenient and reliable that an atomic force microscope is used for the measurement of the surface roughness to take a RMS (root-mean-square) value over a measuring area of 1 μm×1 μm.

In the prior art, the surface roughness of a mirror-polished silicon wafer used as the substrate of EPWs has a RMS value smaller than 0.3 nm. In contrast thereto, the surface roughness of the mirror-polished silicon wafer as the substrate of an EPW according to the present invention is controlled within the range from 0.3 nm to 1.2 nm by the conventional method for the primary mirror-polishing.

On the other hand, as a further constituent factor of the surface roughness, so-called "ripples", which are wavy forms having a period of 10 to 100 μm, though with a P-V value of about the same order as the haze, can be observed with an optical interferential surface roughness tester (Model TOPO-3D, manufactured by WYCO Co.). According to the results of the inventors, however; the above mentioned haze is not reproduced on the surface of the epitaxial layer when the film thickness of the epitaxial layer exceeds about 1 μm but the wavy surface roughness corresponding to ripples is reproduced on the surface of the epitaxial layer.

According to the result of the simulation heat treatment test for an assumed manufacturing process of a semiconductor device with the EPW obtained by the present invention, it has been confirmed that, provided that the film thickness of the epitaxial layer in the EPW is at least about 1 μm, no substantial difference is found in the electric voltage-withstanding characteristic of the gate oxidized film of a MOS capacitor as compared with a similar device prepared from a conventional EPW using a mirror-polished wafer polished under a conventional control standard.

In the present invention, namely, it has been unexpectedly discovered that the EPW after growth of the epitaxial layer of silicon is free from the influence of the haze and/or ripples provided only that the level of the haze or ripples on the mirror-polished surface of the silicon wafer as the substrate of the EPW be controlled at a level not exceeding 5 nm in the P-V value or the above mentioned RMS value by an atomic force microscope be controlled not to exceed 1.2 nm.

While it was a general understanding in the prior art that a mirror-polished silicon single crystal wafer, which serves as a substrate of an EPW, must be imparted with a surface roughness of 0.3 nm or smaller by conducting the mirror-polishing work in several steps beginning with the primary polishing, the inventors unexpectedly have arrived at a discovery that an EPW having the same excellent quality suitable for a base material of semiconductor devices as those prepared from conventional mirror-polished silicon wafers can be obtained from a mirror-polished silicon wafer having a surface roughness of 0.3 to 1.2 nm obtained by conducting the primary polishing step only of the mirror polishing work by omitting the subsequent polishing steps.

It has also been concluded that, in conducting additional polishing and washing to eliminate the haze as in the prior art, in particular, on a silicon wafer of low-resistivity grade of which mirror polishing is considered to be difficult heretofore, practice is possible with the requirement of the present invention to undertake the primary mirror-polishing only.

In the following, the present invention is described in more detail by way of an example and comparative examples as preceded by the description of the method for the preparation of the testing samples of EPWs as well as the measuring methods of the electric properties thereof.

(1) Preparation of Mirror-polished Wafer Samples

Five groups of mirror-polished silicon wafer samples, referred to as Samples A, B, C, D and E hereinafter, were prepared by undertaking differently scheduled polishing procedures described below.

Sample A was prepared by undertaking the primary mirror-polishing only with omission of the subsequent polishing steps including the secondary polishing and finish polishing corresponding to the present invention. The detailed conditions in the primary polishing were as follows.
Abrasive cloth
  Type: velour type
  Hardness: 70 to 80
  Compression: 3 to 10%
  Compressive modulus: 75 to 80%
Abrasive
  Base: amine
  Abrasive particles: colloidal silica
  Average particle diameter: 20 to 40 nm
Polishing conditions
  Load: 200 to 400 g/cm$^2$
  Time: ca. 10 minutes
  Slurry temperature: 20° to 25° C.

Sample B was subjected to the secondary polishing after the primary polishing under the same conditions as for Sample A. The detailed conditions in the secondary polishing were as follows.
Abrasive cloth
  Type: velour type
  Hardness: 60 to 70
  Compression: 10 to 25%
  Compressive modulus: 80 to 85%
Abrasive
  Base: aqueous solution of sodium hydroxide
  Abrasive particles: colloidal silica
  Average particle diameter: 10 to 20 nm
Polishing conditions
  Load: 100 to 200 g/cm$^2$
  Time: ca. 10 minutes
  Slurry temperature: 20° to 25° C.

Sample C was subjected to the finish polishing after the primary and secondary polishing steps under the same conditions as for Sample B. The detailed conditions in the finish polishing were as follows.
Abrasive cloth
  Type: suede type
  Hardness: 60 to 70
  Compression: 3 to 7%
  Compressive modulus: 50 to 70%
Abrasive
  Base: ammonia water
  Abrasive particles: colloidal silica
  Average particle diameter: 20 to 40 nm
Polishing conditions
  Load: ca. 100 g/cm$^2$
  Time: ca. 10 minutes
  Slurry temperature: 20° to 25° C.

Sample D was polished under the same conditions as for Sample C excepting extension of the time for the finish polishing to about 20 minutes instead of 10 minutes.

Sample E was polished under the same conditions as for Sample C excepting extension of the time for the finish polishing to about 30 minutes instead of 10 minutes.

(2) Conditions for the Growth of the Epitaxial Layer of Silicon

After undertaking the washing and drying treatments in a conventional manner, an epitaxial layer of silicon having a thickness of 4 μm was formed on the mirror-polished surface of the Samples A to E under the following conditions in a barrel-type reaction apparatus.

Temperature of vapor-phase growing: 1130° C.
Velocity of vapor-phase growing: 0.5 μm/minute
Time of vapor-phase growing: 8 minutes The above mentioned thickness of the epitaxial layer is relatively small for the standard thickness of EPWs and the relatively low vapor-phase growing velocity of 0.5

µm/minute was selected so as to obtain ready formation of haze on the epitaxial layer according to the preliminary study for the evaluation of the influences of the velocity on the electric properties described later.

(3) Measurement of Surface Roughness

Measurement was performed with an atomic force microscope for the RMS value on the center area of the wafer.

(4) Conditions of CMOS Simulating Heat Treatment

Figure 4:
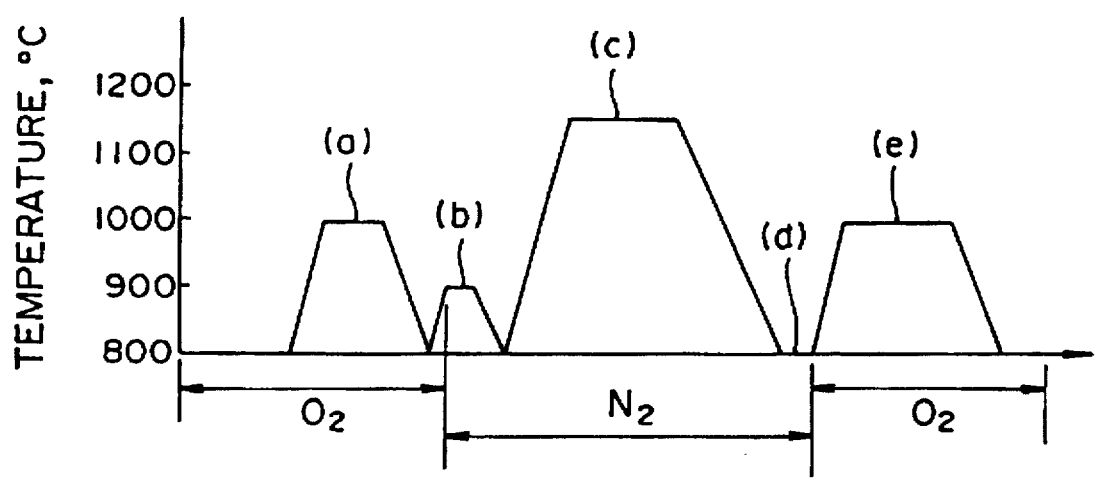
FIG. 4 shows the temperature profile in the CMOS simulation heat treatment undertaken for the evaluation of the EPWs of the present invention.

In a heat treatment for simulation assuming preparation of a CMOS semiconductor device, each of the EPW samples was subjected to the heat treatment according to the heating and cooling schedules indicated in FIG. 4 to study the influences thereof. The parameters for heating and cooling are as follows.

Ramp-up rate: 6° C./minute
Ramp-down rate: 3° C./minute
Entering and leaving velocity: 10 cm/minute
Stage (a): 2 hours at 1000° C.
Stage (b): 1 hour at 900° C.
Stage (c): 6 hours at 1150° C.
Stage (d): 1 hour at 800° C.
Stage (e): 6 hours at 1000° C.
Atmosphere: oxygen or nitrogen (indicated in the figure)

(5) Method for the Measurement of Electric Voltage-withstanding Characteristic

The electric voltage-withstanding characteristic of the gate oxidized film is a parameter for the reliability evaluation of the oxidized film, and measurement thereof was conducted by the stepped-current TDDB (time-dependent dielectric breakdown) method. The principle of this method is that, while an electric current under step-wise increasing within a specified unit time is applied to the MOS capacitor, the overall electric charge is measured until the MOS capacitor is destroyed and the current density is evaluated with the value of J×t (C/cm$^2$) which is the current density J (A/cm$^2$) multiplied by the time (t).

Figure 5:
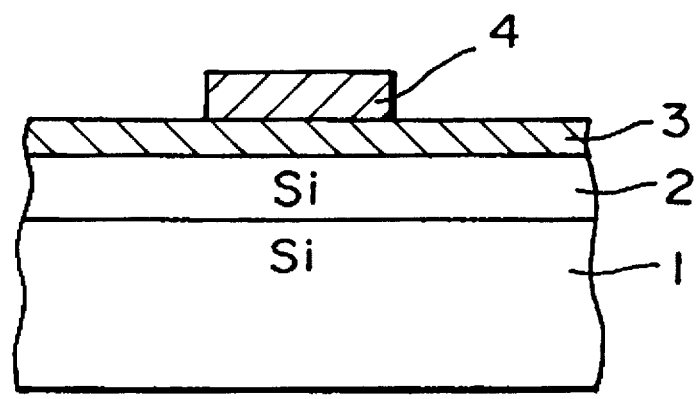
FIG. 5 is a schematic cross sectional view showing the structure of the MOS capacitor for conducting the withstand voltage measurement of the gate oxidized film by the stepped-current TDDB method with an object of evaluation of the EPW of the present invention.

FIG. 5 schematically illustrates the method for the measurement of the electric voltage-withstanding characteristic of a gate oxidized film in the capacitor structure of a MOS consisting of a single crystal silicon wafer 1 as the substrate, an epitaxial layer 2 of silicon formed on the mirror-polished surface of the substrate 1, an oxidized gate layer 3 of silicon dioxide and a gate electrode 4 of a polycrystalline silicon layer having a dimension of 1 mm×1 mm so as to enable passing of a step-wise electric current under application of a step-wise increased voltage between the gate electrode 4 and the mirror-polished substrate wafer 1 fixed by means of a metal-made vacuum chuck (not shown in the figure) to conduct the measurement at 100 spots on an EPW of 150 mm diameter.

EXAMPLE 1 AND COMPARATIVE EXAMPLES 1 TO 4

(a) Preparation of Mirror-polished Wafers

For the preparation of various samples of mirror-polished wafer to be the substrate of an EPW, 40 chemically etched wafers were prepared from a single crystal silicon rod grown by the CZ method, of which the electroconductivity type was the p-type, axial direction of pulling-up was <100>, diameter was 150 mm and electric resistivity was in the range from 0.008 to 0.020 ohm.cm.

From eight a group of the chemically etched 40 wafers, eight a group of mirror-polished wafers were prepared corresponding to the Sample A (Example 1) and Samples B to E (Comparative Examples 1 to 4, respectively) under the conditions described above. The abrasive used in the primary polishing was AJ-1325 (product by Nissan Chemical Co.) and the abrasive cloth was Suba-500 (product by Rodale Nitta Co.).

Two test specimens were taken from eight of each group of the thus obtained mirror-polished wafers Samples A to E and they were subjected to the measurement of the surface roughness with an atomic force microscope on a 1 µm by 1 µm wide area and an average value was obtained for the two. The results of measurement are shown by the filled-circle marks on the solid-line curve 1 in FIG. 1.

(b) Preparation of EPW

In the next place, an epitaxial layer of silicon having a thickness of 4 µm was formed on each of six a group of the remaining mirror-polished wafers by the specified method described above to prepare an EPW followed by the measurement of the surface roughness for the surface of two taken out of each group in the same manner as in (a) above and an average value was obtained for the two. The results of the surface roughness measurement are shown by the open-circle marks on the broken-line curve 2 in FIG. 1.

(c) CMOS Simulation Heat Treatment

Three of six a group of the EPWs mentioned above in (b) were subjected to a CMOS simulation heat treatment followed by the measurement of the surface roughness for the surface of two taken out from each group in the same manner as in (a) above and an average value was obtained for the two. The results of measurement are shown by the cross marks on the chain-line curve 3 in FIG. 1.

(d) Measurement of Withstand Voltage of Oxidized Film

Five EPWs belonging to the Samples A to E prepared in (b) described above and five EPWs after the CMOS simulation heat treatment belonging to the Samples A to E prepared in (c) described above were subjected to the withstand voltage test by the specified method. The results of measurements are shown by the width of the measured values given by the vertical line segments in FIG. 3 having a center at the open-circle mark on each vertical line segment indicating an average value for 100 measuring spots. The five vertical line segments at the left side are for the EPWs before the simulation heat treatment and the five vertical line segments at the right side are for the EPWs after the heat treatment.

(e) Discussion on the Results

In connection with the polishing conditions for the samples A to E, the Sample A is for indication of the polishing conditions corresponding to the present invention with the primary polishing only while it is pointed out that Sample B is along the lines of the conditions of the present invention because of the polishing works conducted in two steps alone including the primary and secondary polishing steps.

As is mentioned above, however, Sample C is for the standard mirror-polishing procedure in the prior art by undertaking polishing in three steps including the primary, secondary and finish polishing steps and the remaining Samples D and E are also after polishing in three steps so that they correspond to comparative examples of the present invention.

As is shown in FIG. 1, the surface roughness of the mirror-polished wafer at the initial stage in Example 1 (Sample A) by undertaking the primary polishing only is about 0.8 nm while this surface roughness is about 0.2 nm at the stage of EPW by the formation of an epitaxial layer of silicon having a thickness of 4 μm to be at the same level as in the samples of other polishing conditions as the comparative examples and this trend is unchanged even after the CMOS simulation heat treatment.

Figure 3:
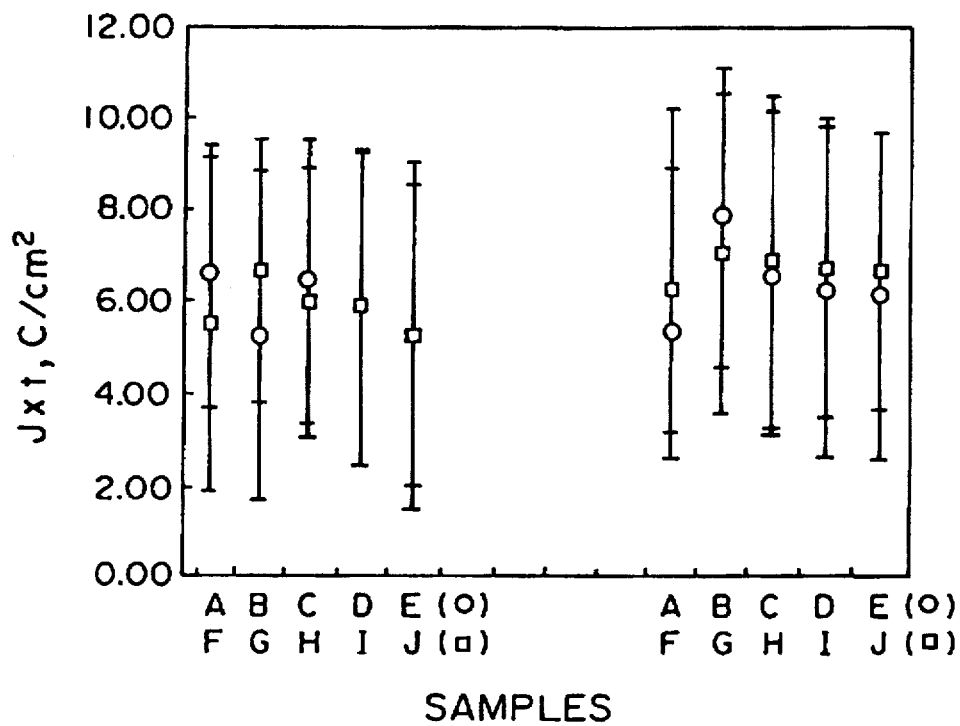
FIG. 3 is a figure for the explanation of Example 1 of the present invention and Comparative Examples 1 to 4 and Example 2 of the present invention and Comparative Examples 5 to 8 in combination.

In connection with the withstand voltage illustrated in FIG. 3, the withstand voltage of Sample A according to the present invention is not inferior to the other samples, i.e. Samples B to E given for comparative purpose, not only at the stage of EPW but also at the stage after the CMOS simulation heat treatment thereof to evidence that the EPW according to the present invention satisfies the requirements for the preparation of semiconductor devices.

EXAMPLE 2 AND COMPARATIVE EXAMPLES 5 TO 8

(a) Outline of the Conditions and Results of Experiments

The experimental conditions were substantially the same as in Example 1 and Comparative Examples 1 to 4 described above except that the single crystal silicon wafers used as the substrates of EPWs had an electric resistivity in the range from 8 to 15 ohm.cm instead of 0.008 to 0.02 ohm.cm to prepare Samples F, G, H, I and J, of which the mirror-polishing conditions were the same as for the Samples A, B, C, D and E, respectively.

Figure 2:
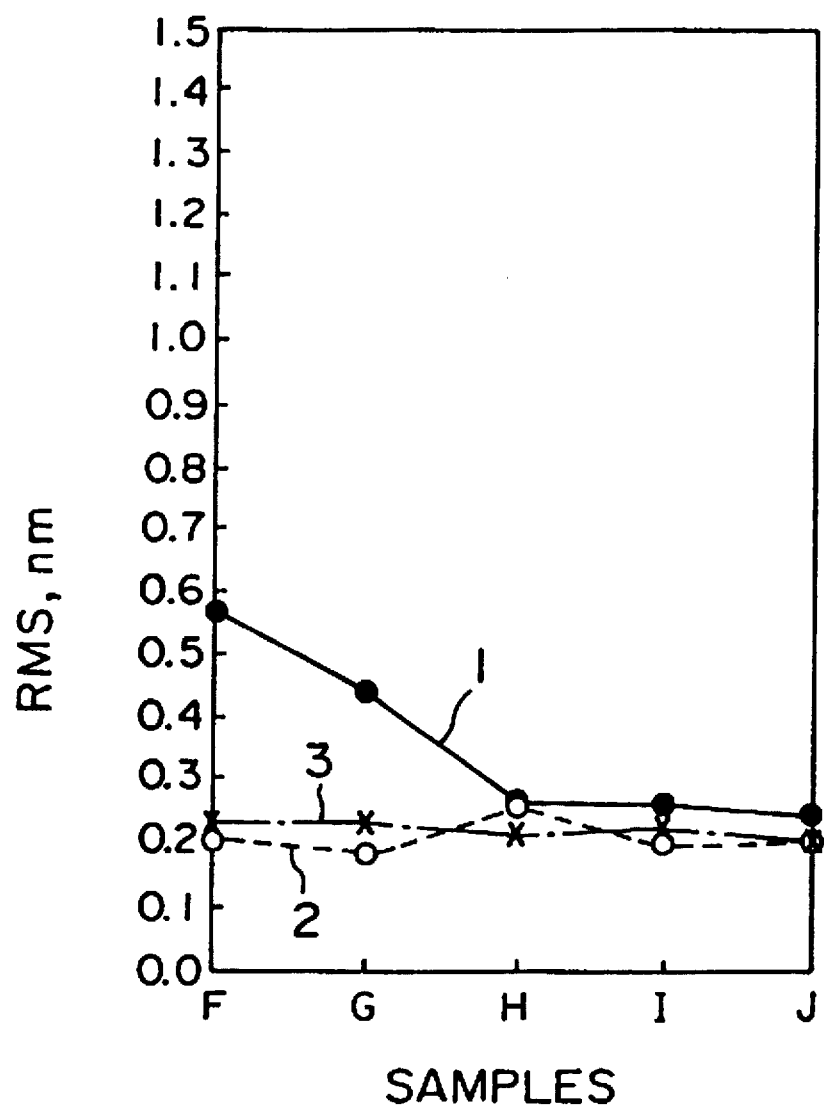
FIG. 2 shows the surface roughness of wafers prepared by mirror-polishing under different conditions in Example 2 and Comparative Examples 5 to 8.

FIG. 2, which is similar to FIG. 1, shows the results of the surface roughness measurements on the mirror-polished wafers, EPWs prepared by using the respective mirror-polished wafers as the substrate and the same EPWs after the heat treatment belonging to the Samples F to J by the filled-circle marks on the solid-line curve 1, open-circle marks on the broken-line curves 2 and cross marks on the chain-line curve 3, respectively.

FIG. 3 also shows the results obtained by the withstand voltage measurements of the oxidized film for the five EPWs corresponding to Samples F to J either before (left side) or after (right side) the CMOS simulation heat treatment. The results are shown by the respective vertical line segments giving the distribution width of the measured values having an average values indicated by the open-square marks.

(b) Discussion of the Results

The results obtained as shown above lead to about the same conclusion as in Example 1 and Comparative Examples 1 to 4.

When comparison is made between FIG. 1 and FIG. 2, however, it is noted that the value of surface roughness is larger and unstable in Example 1 (Sample A) by using mirror-polished wafers of low-resistivity grade as compared with Example 2 (Sample F) by using mirror-polished wafers of normal-resistivity grade despite the identical conditions for the primary mirror polishing.

In the prior art, a very strict control is required in the mirror-polished wafers to be used as the substrate of EPWs for the surface condition thereof. This is because, in relation to the crystallinity and surface roughness as well as purity and the like of the epitaxially grown layer by the vapor-phase growing method on the mirror-polished wafer surface, it is accepted that the surface condition thereof has a direct influence on the quality of the epitaxial layer.

According to the present invention, however, a conclusion has been obtained that the influence of the surface roughness of substrate wafers is not so great as supposed in the prior art as to the problems of the surface roughness of the EPWs prepared from the wafers and the electric withstand voltage of semiconductor devices, provided that the requirements in the present invention relative to the surface roughness of the mirror-polished wafer are satisfied.

According to the present invention, various problems can be solved altogether including the increase in the number of polishing steps, extension of the overall polishing time, repetition of washing and so on while these problems are particularly serious in the manufacture of mirror-polished wafers of low-resistivity grade.

In addition, the surface roughness of the mirror-polished wafer required in the present invention can be accomplished by the primary polishing only by omitting the succeeding mirror-polishing steps undertaken in the conventional mechanochemical method irrespective of the electric resistivity of the wafers without undertaking any other particular means.

Accordingly, the advantage of the present invention is very great for the productivity improvement and cost reduction due to the simplification of the mirror-polishing process relative to the mirror-polished wafers or EPWs manufactured by utilizing the same.

What is claimed is:

1. An epitaxial wafer which comprises:

(a) a substrate of a single crystal silicon wafer; and (b) an epitaxial layer of silicon formed by the vapor phase growing method on one of the flat surfaces of the substrate, the surface of the substrate on which the epitaxial layer of silicon is formed having a surface roughness RMS in the range from 0.3 nm to 1.2 nm before formation of the epitaxial layer.

2. The epitaxial wafer as claimed in claim 1 in which the epitaxial layer of silicon formed on one of the flat surfaces of the substrate has a thickness of at least 1 μm.

\* \* \* \* \*